United States Patent
Choi et al.

[11] Patent Number: 5,918,114
[45] Date of Patent: Jun. 29, 1999

[54] METHOD OF FORMING VERTICAL TRENCH-GATE SEMICONDUCTOR DEVICES HAVING SELF-ALIGNED SOURCE AND BODY REGIONS

[75] Inventors: Yong-Cheol Choi; Chang-Ki Jeon, both of Kyungki-do, Rep. of Korea

[73] Assignee: Samsung Electronics Co., Ltd., Suwon, Rep. of Korea

[21] Appl. No.: 08/855,459

[22] Filed: May 13, 1997

[51] Int. Cl.$^6$ .................................................. H01L 21/332
[52] U.S. Cl. ........................ 438/134; 438/270; 438/274
[58] Field of Search .................................. 438/134, 270, 438/274, 301, 305, 598

[56] References Cited

U.S. PATENT DOCUMENTS

| | | | |
|---|---|---|---|
| 4,685,196 | 8/1987 | Lee | 437/41 |
| 5,362,665 | 11/1994 | Lu | 437/52 |

Primary Examiner—John F. Niebling
Assistant Examiner—Michael S. Lebentritt
Attorney, Agent, or Firm—Myers Bigel Sibley & Sajovec

[57] ABSTRACT

Methods of forming vertical trench-gate semiconductor devices include the steps of patterning an oxidation resistant layer having an opening therein, on a face of a semiconductor substrate, and then forming a trench in the semiconductor substrate, opposite the opening in the oxidation resistant layer. An insulated gate electrode is then formed in the trench. The face of the semiconductor substrate is then oxidized to define self-aligned electrically insulating regions in the opening and at a periphery of the patterned oxidation resistant layer. Here, the patterned oxidation resistant layer is used as an oxidation mask so that portions of the substrate underlying the oxidation resistant layer are not substantially oxidized. Source and body region dopants of first and second conductivity type, respectively, are then implanted into the substrate to define preliminary source and body regions which extend adjacent a sidewall of the trench. During the implanting step, the electrically insulating regions are used as a self-aligned implant mask. The implanted dopants are then diffused into the substrate to define source and body regions adjacent upper and intermediate portions of the sidewall of the trench, respectively.

20 Claims, 3 Drawing Sheets

METHOD OF FORMING VERTICAL TRENCH-GATE SEMICONDUCTOR DEVICES HAVING SELF-ALIGNED SOURCE AND BODY REGIONS

FIELD OF THE INVENTION

The present invention relates to methods of forming semiconductor switching devices, and more particularly to methods of forming semiconductor switching devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop of power MOSFETs increases with increasing temperature, thereby promoting an even current distribution in parallel connected devices.

It has also been considered attractive to combine the best features of power MOSFETs and bipolar transistors into a single device structure. In particular, since bipolar current conduction allows for operation at high on-state current densities with low on-state voltage drop and MOS-gate structures provide preferred gate control, it has been considered advantageous to develop devices where bipolar current transport is controlled via a MOS-gate structure. Such devices, typically referred to as insulated-gate bipolar transistors (IGBTs), have been developed to include the preferred features of bipolar transistors and power MOSFETs.

In view of these desirable characteristics of power MOSFETs and IGBTs, many variations of providing MOS-gate control have been developed. For example, as illustrated by FIG. 1, a TDMOS transistor unit cell is illustrated. As will be understood by those skilled in the art, this transistor is a type of double-diffused MOS transistor. In this device, a body region 4 of P-type conductivity is formed on an N-type substrate 1 and a more highly doped and deeper P-type contact region 2 is formed to surround the body region 4. A source region 5 of N-type conductivity is provided in the body region 4. A trench is formed by etching through the source region 5 and body region 4 using conventional techniques. A gate insulating layer 7 is formed on a sidewall and bottom of the trench. The trench is filled with a polysilicon gate electrode 3 and an oxide layer 6 covers the face of the substrate 1 and the gate electrode 3.

In order to form the TDMOS transistor, the body region 4 and contact region 2 are formed by implanting and diffusing P-type dopants using first and second implant masks. The source region 5 is formed by implanting N-type dopants using a third mask. Thereafter, the trench is formed using a fourth mask. Unfortunately, during the steps of forming the trench and the gate insulating layer 7 (which typically includes a thermal treatment step such as a thermal oxidation step), the dopants in the body region 4 and contact region 2 continue to diffuse into the substrate 1. This can cause the concentration of P-type dopants adjacent the sidewall of the trench to be lowered and the threshold voltage of the TDMOS transistor to be lowered. As will be understood by those skilled in the art, such changes can lead to a parasitic increase in leakage current during device operation.

Thus, notwithstanding the above attempts to develop power MOSFETs and MOSFET-controlled semiconductor devices, there still continues to be a need for improved semiconductor devices for power applications.

SUMMARY OF THE INVENTION

It is therefore an object of the present invention to provide improved methods of forming vertical semiconductor devices.

It is another object of the present invention to provide methods of forming vertical trench-gate semiconductor devices using self-alignment techniques.

It is still another object of the present invention to provide methods of forming vertical trench-gate semiconductor devices having improved electrical characteristics.

These and other objects, features and advantages are provided, according to the present invention, by methods of forming semiconductor switching devices which include the steps of patterning an oxidation resistant layer (e.g., $Si_3N_4$) having an opening therein, on a face of a semiconductor substrate, and then forming a trench in the semiconductor substrate, opposite the opening in the oxidation resistant layer. An insulated electrode is then formed in the trench and patterned to define a trench gate electrode. The face of the semiconductor substrate is then oxidized to define self-aligned electrically insulating regions at a periphery of the patterned oxidation resistant layer. Here, the patterned oxidation resistant layer is used as an oxidation mask so that portions of the substrate underlying the oxidation resistant layer are not substantially oxidized. Source and body region dopants of first and second conductivity type, respectively, are then implanted into the substrate to define preliminary source and body regions which extend adjacent a sidewall of the trench. According to a preferred aspect of the present invention, the electrically insulating regions are used as a self-aligned implant mask. The implanted dopants are then diffused into the substrate to define source and body regions adjacent upper and intermediate portions of the sidewall of the trench, respectively.

In particular, according to a preferred embodiment of the present invention, a method of forming a semiconductor switching device includes the steps of forming a blanket first oxide layer on a face of a semiconductor substrate and then forming a blanket first nitride layer on the first oxide layer, opposite the face. The first nitride layer is then patterned using a conventional photolithographically defined etching step to expose the first oxide layer at a periphery of the first nitride layer. Dopants of second conductivity type (e.g. P-type) are then implanted into the semiconductor substrate to define a preliminary contact region of second conductivity type therein, using the patterned first nitride layer as an implant mask. A second oxide layer (e.g., a blanket low temperature oxide (LTO) layer) is then formed on the patterned first nitride layer and on the first oxide layer. A photolithographically defined etching step is then performed to define an opening in the second oxide layer, the first nitride layer and the first oxide layer and expose the face of the semiconductor substrate. The etching step is then continued to also define a trench in the semiconductor substrate.

Once the trench has been formed, a gate oxide layer is formed on a sidewall and bottom of the trench using a conventional thermal oxidation step. The trench is then preferably filled with a polysilicon layer. This polysilicon layer may be doped in-situ using a phosphorus containing atmosphere (e.g., $POCl_3$). The polysilicon layer is then planarized using conventional techniques to define an insulated gate electrode in the trench. The gate electrode and portions of the semiconductor substrate at the periphery of the first nitride layer are then thermally oxidized using a LOCal Oxidation of Silicon (LOCOS) technique and the first nitride layer as an oxidation mask, to form electrically insulating regions. These electrically insulating regions are self-aligned to the opening in the first nitride layer and the periphery of the first nitride layer. Dopants of first and second conductivity type are then implanted into the substrate to define preliminary source and body regions therein which extend adjacent a sidewall of the trench. These preliminary source and body regions are self-aligned to the electrically insulating regions which are used collectively as an implant mask. A thermal treatment step is then performed to simultaneously diffuse the dopants in the preliminary source, body and contact regions into the substrate. This thermal treatment step (e.g., diffusion step) is performed for sufficient duration to define source and body regions adjacent upper and intermediate portions of the sidewall of the trench, respectively, and define a contact region which is merged with the body region at a location spaced from the sidewall of the trench. Accordingly, to prevent parasitic redistribution of the body and contact region dopants at the back end of processing, the body and contact region dopants are not diffused to substantially their full and final depths in the semiconductor substrate until after the trench and electrically insulating regions have been formed.

DESCRIPTION OF PREFERRED EMBODIMENTS

Figure 1:
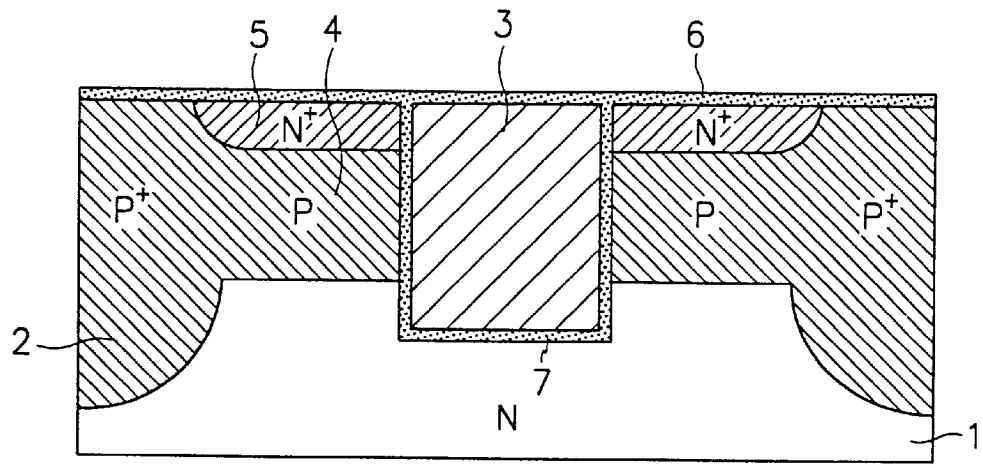
FIG. 1 illustrates a cross-sectional view of a vertical trench-gate MOSFET according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Referring now to FIGS. 2 and 3A–3F, methods of forming semiconductor switching devices according to the present invention will be described. These semiconductor switching devices may comprise vertical power semiconductor devices such as ICFETs (e.g., MOSFETs), insulated-gate bipolar transistors (IGBTs) and insulated-gate thyristors, for example. As illustrated best by FIGS. 2 and 3F, a vertical power semiconductor device may comprise a semiconductor substrate containing drift region 11 of first conductivity type (e.g., N or N−) therein on a more highly doped buffer region (not shown). The buffer region may be ohmically coupled to a drain electrode (not shown) or the buffer region may be provided on an emitter region of second conductivity type (not shown) having an anode electrode coupled thereto. As will be understood by those skilled in the art, the drift region 11 may be formed by epitaxially growing an in-situ doped layer of monocrystalline silicon on an upper surface of the buffer region. A trench gate electrode 13 is also provided in a trench extending from a first face of the semiconductor substrate into the drift region 11. The trench gate electrode is preferably electrically insulated from a sidewall and bottom of the trench by a gate insulating layer 26 (e.g., gate oxide layer). The trench extends in a third dimension (not shown) and may be of stripe, circular, hexagonal or similar pattern, as will be understood by those skilled in the art. A body region 14 of second conductivity type (shown as P-type) is also provided in the substrate. The body region 14 preferably extends adjacent a intermediate portion of the sidewall of the trench and surrounds the trench so that the sidewall of the trench defines an interface between the gate insulating layer 26 and the body region 14. A contact region 12 of second conductivity type is also provided in the substrate. As illustrated, this contact region forms a nonrectifying junction with the body region 14 at a location which is spaced from the sidewall of the trench. This nonrectifying junction (e.g., P/P+) is illustrated by dotted lines. The contact region 12 is preferably highly doped to facilitate the formation of an ohmic contact between the contact region 12 and a body electrode or cathode (not shown) on the first face. The body and contact regions 14 and 12 may also collectively comprise a collector region of a vertical IGBT. In this configuration, the drift region 11 acts as a floating base region of the vertical IGBT.

A source region 15 of first conductivity type (shown as N-type) is also provided in the substrate. The source region 14 preferably extends adjacent an upper portion of the sidewall of the trench and surrounds the trench so that the sidewall of the trench defines an interface between the gate insulating layer 26 and the source region 15. As illustrated, the source region forms a rectifying junction (e.g., P/N +) with the body region 14 and contact region 12. A source electrode is also preferably ohmically coupled at the first face to a source or cathode electrode (not shown). During the formation of a semiconductor device according to the present invention, an oxide layer 16 and a plurality of electrically insulating regions 110 may also be formed at the first face, as explained more fully hereinbelow with respect to FIGS. 3A–3F.

As will be understood by those skilled in the art, the application of a sufficiently large first potential bias (e.g., positive) to the gate electrode 13 will cause the formation of an inversion layer channel of first conductivity type (e.g., N-type) in the body region 14, at the interface between the gate insulating layer 26 and the body region 14. This inversion layer channel acts as a low resistance path or "short" between the source region 15 and the drift region 11.

Figure 2:
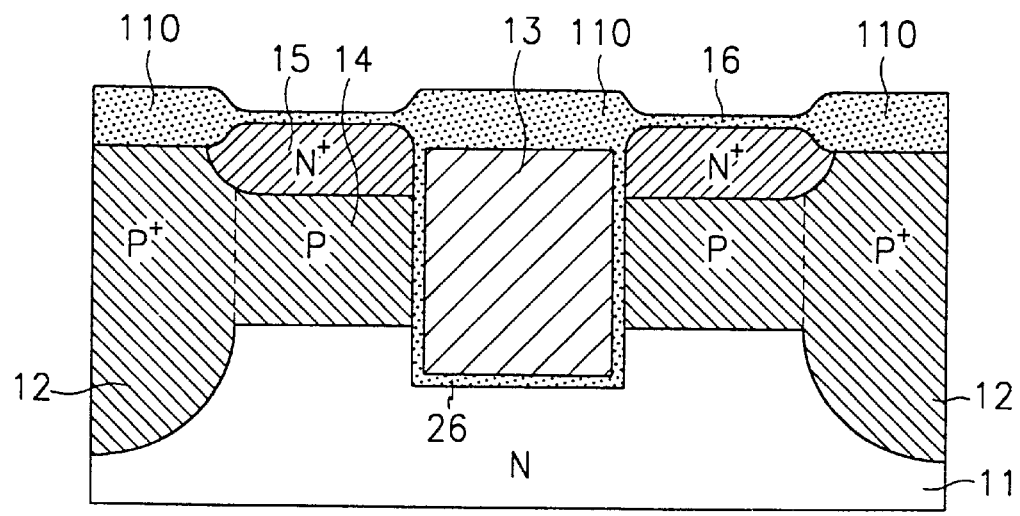
FIG. 2 illustrates a cross-sectional view of a vertical trench-gate semiconductor switching device according to a first embodiment of the present invention.
Figure 3A:
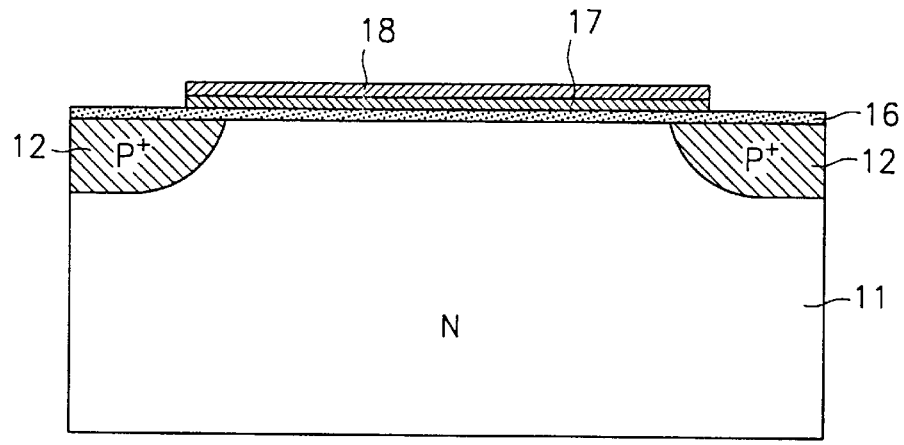
FIGS. 3A–3F illustrate cross-sectional views of intermediate structures illustrating a method of forming the vertical semiconductor switching device of FIG. 2.

Referring now to FIGS. 3A–3F, preferred methods of forming the semiconductor switching device of FIG. 2 will be described. In particular, FIG. 3A illustrates the steps of forming a first oxide layer 16 (e.g., $SiO_2$) on a first face of a semiconductor substrate containing a drift region 11 of first conductivity type therein extending to the first face. The first oxide layer 16 may be formed by thermally oxidizing the first face of the substrate using conventional techniques. A first nitride layer 17 (e.g., $Si_3N_4$) is then formed on the first oxide layer 16, opposite the first face. A layer of photoresist is then patterned to define a mask 18. The patterned layer of photoresist is then used as an etching mask during the step of etching the first nitride layer 17 to expose a portion of the first oxide layer at a periphery of the etched first nitride layer 17. Referring still to FIG. 3A, dopants of second conductivity type (e.g., P-type) are then implanted through the first oxide layer 16 and into the drift region at a relatively high dose level, using the layer of photoresist 18 and first nitride layer 17 as an implant mask. During this implanting step, a relatively highly doped preliminary contact region 12 of second conductivity type is formed in the drift region 11. A relatively short duration diffusion step may also be performed to diffuse the dopants in the preliminary contact region 12 into the drift region 11.

Figure 3B:
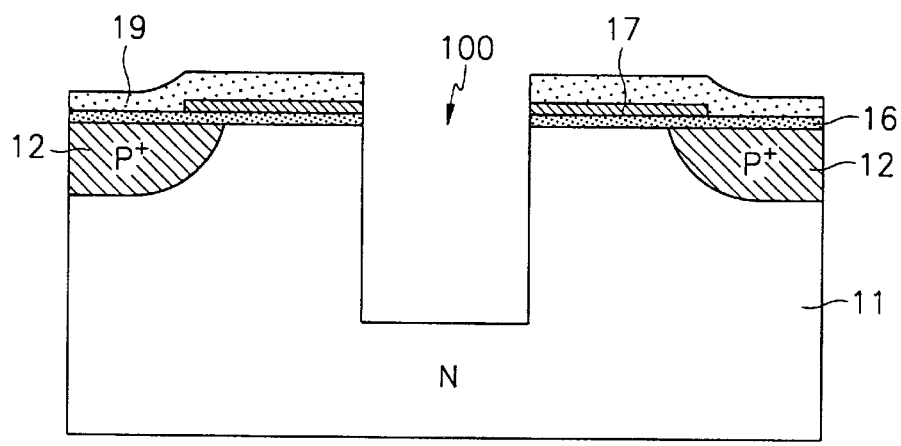

Referring now to FIG. 3B, a second oxide layer 19 (e.g., a low temperature oxide (LTO) layer) is then formed on the first nitride layer 17 and on a portion of the first oxide layer 16 extending opposite the preliminary contact region 12. A layer of photoresist (not shown) is then patterned on the second oxide layer 19 to expose a portion of the second oxide layer 19 extending opposite the first nitride layer 17. The second oxide layer 19, first nitride layer 17 and first oxide layer 16 are then sequentially etched using conventional etching techniques and the layer of photoresist as an etching mask, to define an opening in the first nitride layer 17. The portion of the drift region 11 extending opposite the opening in the first nitride layer 17 is then etched to define a trench 100 in the drift region 11.

Figure 3C:
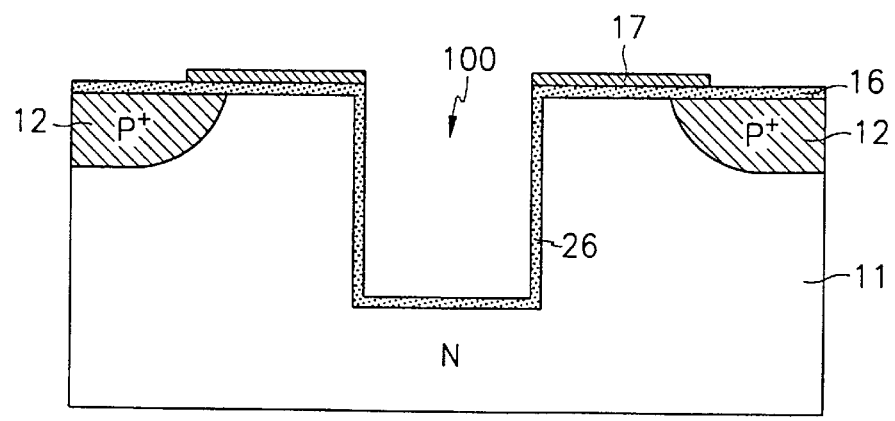
Figure 3D:
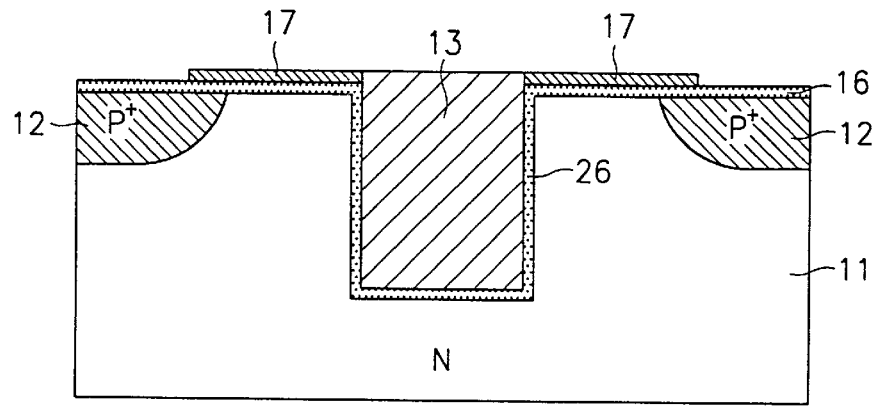

Referring now to FIG. 3C, a thermal oxidation step is preferably performed to form a gate insulating layer 26 on the sidewall and bottom of the trench 100. Here, the second oxide layer 19 may be removed before the gate insulating layer 26 is formed. Referring now to FIG. 3D, a layer of polycrystalline silicon is then deposited into the trench and planarized using conventional techniques such as chemical-mechanical polishing (CMP), to form a gate electrode 13. The gate electrode 13 may be doped with a suitable dopant of first conductivity type. In particular, the gate electrode 13 may be doped in-situ with phosphorus by exposing the deposited layer of polycrystalline silicon to a $POCl_3$ atmosphere, as will be understood by those skilled in the art. The first nitride layer 17 may also be used as a planarization/etch stop during the step of polishing the deposited layer of polycrystalline silicon.

Figure 3E:
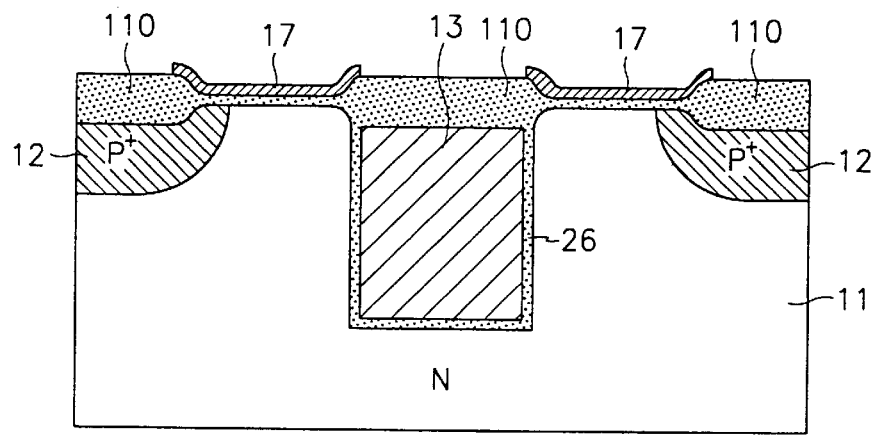
Figure 3F:
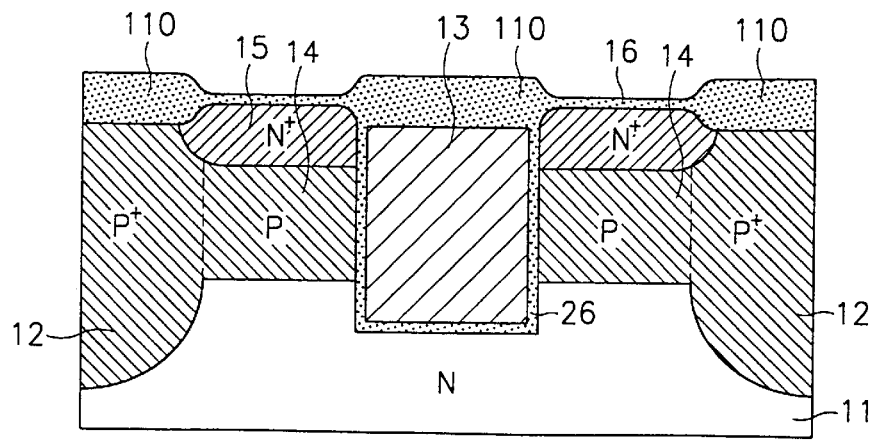

As illustrated best by FIG. 3E, relatively thick electrically insulating regions 110 may then be formed by thermally oxidizing the gate electrode 13 and the preliminary contact region 12 of second conductivity type using the first nitride layer 17 as an implant mask. Here, according to a preferred aspect of the present invention, the electrically insulating regions 110 are formed as regions which are self-aligned to the opening in the first nitride layer 17 and the periphery of the first nitride layer 17. Referring now to FIG. 3F, dopants of first and second conductivity type are then implanted in sequence into the drift region 11, and at respective first and second energies to form a relatively shallow self-aligned preliminary source region of first conductivity type and a relatively deep self-aligned preliminary body region of second conductivity type. Here, the electrically insulating regions 110 are formed to be of sufficient thickness to act as an implantation mask. The dopants in the preliminary contact region 12 and preliminary source and body regions are then diffused simultaneously into the drift region 11 to define a source region 15 extending adjacent (and surrounding) an upper portion of the sidewall of the trench, a body region 14 extending adjacent (and surrounding) an intermediate portion of the sidewall of the trench and a contact region 12 which forms a non-rectifying junction (illustrated by dotted lines) with the body region at a location spaced from the sidewall of the trench, as illustrated.

As will be understood by those skilled in the art, the depth of the junction between the contact region 12 and the drift region 11 is preferably greater than the depth of the trench and the depth of the junction between the body region 14 and the drift region 11. This greater depth can be achieved by implanting the dopants for the preliminary contact region at a higher energy than the dopants for the preliminary body region and at an earlier stage in the process (see, e.g., FIG. 3B) so that substantial diffusion of the preliminary contact region dopants can take place before the source, body and contact region dopants are simultaneously diffused. In particular, during the step of forming the electrically insulating regions 110 (which typically includes substantial thermal treatment), the dopants in the preliminary contact region will diffuse downward into the drift region 11 and basically have a "head-start" relative to the body region dopants and source region dopants. Vias may then be formed in the electrically insulating regions 110 and first oxide layer 16 to expose the contact region 12 and the source region 15 at the first face of the semiconductor substrate and expose the insulated gate electrode 13. Conventional metallization steps may then be performed to define gate, source and body electrodes for a vertical MOSFET or gate and cathode electrodes for a vertical IGBT. Moreover, as described above, because the body and source regions are not formed until after the trench and electrically insulating regions are formed, the parasitic segregation phenomenon can be prevented.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor switching device, comprising the steps of:
    patterning an oxidation resistant layer to define an opening therein, on a face of a semiconductor substrate;
    forming a trench in the semiconductor substrate, opposite the opening in the oxidation resistant layer;
    forming an electrode in the trench;
    oxidizing the semiconductor substrate to form electrically insulating regions at a periphery of the patterned oxidation resistant layer, using the patterned oxidation resistant layer as an oxidation mask; and
    implanting dopants of first and second conductivity type into the semiconductor substrate to define preliminary source and body regions therein extending adjacent a sidewall of the trench, using the electrically insulating regions as an implant mask.

2. The method of claim 1, wherein said oxidizing step comprises oxidizing the electrode and the face of the semiconductor substrate to form electrically insulating regions at the opening and at the periphery of the patterned oxidation resistant layer.

3. The method of claim 2, wherein said step of implanting dopants of first and second conductivity type is followed by the step of diffusing the implanted dopants of first and second conductivity type to define a source region of first conductivity type extending adjacent the face of the semiconductor substrate and a body region of second conductivity type extending between the source region and a bottom of the trench.

4. The method of claim 2, wherein said step of patterning an oxidation resistant layer comprises the steps of:
    forming a first oxide layer on the face;
    forming a first nitride layer on the first oxide layer, opposite the face; and
    etching the first nitride layer to expose the first oxide layer at a periphery thereof.

5. The method of claim 4, wherein said step of etching the first nitride layer is followed by the step of implanting dopants of second conductivity type into the semiconductor substrate to define a preliminary contact region of second conductivity type therein, using the first nitride layer as an implant mask.

6. The method of claim 5, wherein said step of patterning an oxidation resistant layer further comprises etching the first nitride layer to define the opening, after said step of implanting dopants of second conductivity type into the face; and wherein said trench forming step comprises etching the semiconductor substrate at a location extending opposite the opening in the first nitride layer.

7. The method of claim 6, wherein said electrode forming step comprises oxidizing a sidewall of the trench and then forming a polysilicon gate electrode of first conductivity type in the trench.

8. The method of claim 7, wherein said oxidizing step comprises oxidizing the face of the semiconductor substrate and the polysilicon gate electrode to form electrically insulating regions at the opening and at the periphery of the first nitride layer.

9. The method of claim 5, wherein said step of implanting dopants of second conductivity type into the semiconductor substrate is followed by the step of forming a second oxide layer on the first nitride layer and on a portion of the first oxide layer extending opposite the preliminary contact region; and wherein said step of patterning an oxidation resistant layer further comprises etching the second oxide layer, the first nitride layer and the first oxide layer, in sequence, to define the opening and expose the face of the semiconductor substrate.

10. The method of claim 9, wherein said electrode forming step comprises oxidizing a sidewall of the trench and then forming a polysilicon gate electrode in the trench.

11. The method of claim 10, wherein said oxidizing step comprises oxidizing the polysilicon gate electrode and oxidizing the preliminary contact region at the face of the semiconductor substrate, to form electrically insulating regions at the opening and at the periphery of the first nitride layer.

12. The method of claim 11, wherein said step of implanting dopants of first and second conductivity type is followed by the step of diffusing the dopants in the preliminary source, body and contact regions into the semiconductor substrate to define a source region of first conductivity type extending adjacent the face of the semiconductor substrate, a body region of second conductivity type extending between the source region and a bottom of the trench and a contact region of second conductivity type forming rectifying and non-rectifying junctions with the source and body regions, respectively.

13. A method of forming a semiconductor switching device, comprising the steps of:
    forming a first oxide layer on a face of a semiconductor substrate containing a drift region of first conductivity type therein extending to the face;
    forming a first nitride layer on the first oxide layer, opposite the face;
    etching the first nitride layer to expose the first oxide layer at a periphery thereof; then
    implanting dopants of second conductivity type into the drift region to define a preliminary contact region therein, using the first nitride layer as an implant mask; then
    etching the first nitride layer and first oxide layer to define an opening therein exposing the face of the semiconductor substrate;
    etching the semiconductor substrate at the opening to define a trench therein;
    forming an insulated gate electrode in the trench;
    oxidizing the insulated gate electrode and the preliminary contact region to form self-aligned electrically insulating regions therein, using the first nitride layer as an oxidation mask;
    implanting dopants of first and second conductivity type into the drift region at respective first and second energies to define preliminary source and body regions therein, using the electrically insulating regions as an implant mask; and diffusing the dopants in the preliminary source, body and contact regions into the drift region to define a source region extending adjacent an upper portion of a sidewall of the trench, a body region extending adjacent an intermediate portion of the sidewall of the trench and a contact region forming a non-rectifying junction with the body region at a location spaced from the sidewall of the trench.

14. The method of claim 13, wherein said step of implanting dopants of first and second conductivity type into the drift region is preceded by the step of removing the first nitride layer.

15. The method of claim 14, wherein said step of implanting dopants of first and second conductivity type into the drift region comprises implanting dopants through the first oxide layer and into the face of the semiconductor substrate.

16. The method of claim 14, wherein said step of forming an insulated gate electrode in the trench comprises thermally oxidizing the sidewall of the trench to form a gate insulating layer and then depositing polycrystalline silicon into the trench and then planarizing the polycrystalline silicon using the first nitride layer as an planarization stop.

17. The method of claim 16, wherein said step of depositing polycrystalline silicon into the trench comprises in-situ doping the polycrystalline silicon by exposing the polycrystalline silicon to a $POCl_3$ atmosphere.

18. The method of claim 14, wherein said step of etching the first nitride layer and first oxide layer to define an opening therein is preceded by the step of depositing a second oxide layer on the first nitride layer and on the preliminary contact region.

19. The method of claim 18, wherein said step of forming an insulated gate electrode in the trench comprises thermally oxidizing the sidewall of the trench to form a gate insulating layer and then depositing polycrystalline silicon into the trench and then planarizing the polycrystalline silicon using the first nitride layer as an planarization stop.

20. The method of claim 19, wherein said step of depositing polycrystalline silicon into the trench comprises in-situ doping the polycrystalline silicon by exposing the polycrystalline silicon to a $POCl_3$ atmosphere.

* * * * *